United States Patent [19]
Mayer

[11] 3,974,367
[45] Aug. 10, 1976

[54] SOLID-STATE RESOLVER APPARATUS

[76] Inventor: Arthur Mayer, 83-57 118th St., Kew Gardens, N.Y. 11415

[22] Filed: Nov. 4, 1975

[21] Appl. No.: 628,651

[52] U.S. Cl. .............................. 235/189; 235/186; 318/594
[51] Int. Cl.² .......................................... G06G 7/22
[58] Field of Search ........... 235/186, 189, 194, 152, 235/156; 340/347 SY; 318/592, 593, 594, 605, 661

[56] References Cited
UNITED STATES PATENTS

| | | | |
|---|---|---|---|
| 3,457,394 | 7/1969 | Grado | 235/189 |
| 3,684,880 | 8/1972 | Togawa et al. | 235/186 |
| 3,705,980 | 12/1972 | Brickner et al. | 235/189 X |
| 3,757,100 | 9/1973 | Coleman | 235/186 X |
| 3,789,391 | 1/1974 | Brock et al. | 318/594 X |

Primary Examiner—Joseph F. Ruggiero
Attorney, Agent, or Firm—Stevens, Davis, Miller & Mosher

[57] ABSTRACT

A solid-state resolver apparatus comprising cascaded coarse and fine-angle resolvers. The fine-angle resolver includes first and second averaging means for averaging input and output signals, first and second multipliers for multiplying a digital angular input signal by the outputs of the averaging means and first and second summing means for receiving the input signals and the outputs of the multipliers. The outputs of the summing means correspond to the orthogonal components of an output signal obtained by rotating the input signal through a given angle.

7 Claims, 9 Drawing Figures

३,९७४,३६७

SOLID-STATE RESOLVER APPARATUS

BACKGROUND OF THE INVENTION

The present invention relates to resolver apparatus for receiving an electrical input signal representing a vector quantity and generating an electrical output signal corresponding to the vector quantity rotated through a given angle. In particular, the invention comprises fine and coarse-angle solid-state resolvers which are cascaded to provide resolver apparatus having excellent resolution and low error.

Broadly defined, a resolver is a computing device which resolves an input vector into two orthogonal components in the plane of the input vector. Resolvers may also be used to effect the rotation of an input vector through a desired angle to produce an output vector angularly displaced from and coplanar with the input vector.

Typically, the resolver is an electro-mechanical device comprising input and output windings rotatable with respect to each other by positioning a shaft attached to one set of windings. Analog voltages corresponding to the orthogonal components of the input vector are applied to the input windings and the shaft is mechanically rotated through the desired angle to produce voltages at the output windings corresponding to the orthogonal components of the rotated input vector.

SUMMARY OF THE INVENTION

In the present invention, the orthogonal components of the input vector are represented by analog voltages and the total angle through which the input vector is to be rotated is represented by an analog voltage or digitally by an ordered set of logic levels. The total angle is divided into coarse and fine parts, the coarse part being large relative to the fine part. The resolver apparatus employs low-cost solid-state circuitry of considerable reliability.

More specifically, my invention comprises first and second cascaded resolvers, one of the resolvers being a coarse-angle device and the other a small or fine-angle device. The first resolver receives a vectorial input signal having first and second components corresponding to the orthogonal components of an input vector and the second resolver receives a vectorial signal (hereinafter called the intermediate signal) at the output of the first resolver.

The input signal applied to the resolver apparatus also includes a third component or angular input signal corresponding to the total angle through which the input vector is to be rotated. This third component of the input signal has two parts — a first part which corresponds to the coarse part of the total angle and a second part which corresponds to the fine part of the total angle. The first part of the third component of the input signal is applied to the coarse-angle resolver to produce voltages at the output of this resolver corresponding to the orthogonal components produced by rotation of the signal applied to its input through the first part of the total angle. Similarly, the second part of the third component of the input signal is applied to the fine-angle resolver to produce voltages at the output of this resolver corresponding to the orthogonal components produced by rotation of the signal applied to its input through the second part of the total angle. Thus, the voltages at the output of the cascaded coarse-angle and fine-angle resolvers correspond to the orthogonal components produced by rotation of the signal applied to the input of the resolver apparatus through the total angle.

The fine resolver comprises first and second averaging means, each of which has first and second inputs and an output. If the fine-angle resolver is used as the first resolver, the signals applied to the first inputs of the first and second averaging means correspond to the first and second orthogonal components of the input vector. If the fine-angle resolver is used as the second resolver, the signals applied to the first inputs of the averaging means are the orthogonal components of the intermediate signal at the output of the first resolver.

First and second multiplying means, having first inputs coupled to the outputs of the first and second averaging means respectively and second inputs which receive the fine part of the third component of the input signal, have their outputs coupled to the second inputs of second and first summing means respectively. The first and second summing means have first inputs coupled to the first inputs of the first and second averaging means respectively and outputs coupled to the second inputs of the first and second averaging means.

If the fine-angle resolver is used as the first resolver, the voltages at the outputs of the summing means provide an intermediate signal corresponding to the input vector rotated through the fine part of the total angle which is then applied to the coarse-angle resolver. If the fine-angle resolver is used as the second resolver, voltages are generated at its output corresponding to the input vector rotated through the total angle.

DESCRIPTION OF THE PREFERRED EMBODIMENT

Figure 1:
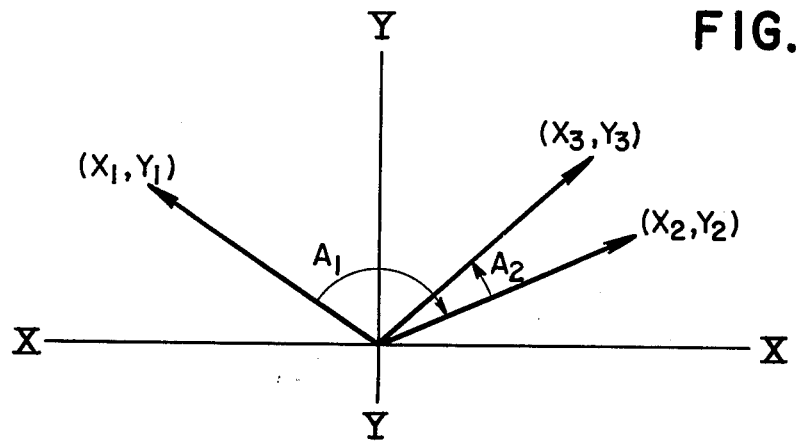
FIG. 1 is a vector diagram useful in explaining the invention.

Referring to the vector diagram of FIG. 1, an input vector is shown rotated from a first position having the coordinates, $X_1$, $Y_1$ through an angle $A_1$ to a second position having the coordinates $X_2$, $Y_2$. This rotation may be defined by the equations:

$$X_2 = X_1 \cos A_1 - Y_1 \sin A_1$$

$$Y_2 = X_1 \sin A_1 + Y_1 \cos A_1 \qquad 1.$$

If the vector is then rotated through an angle $A_2$ from its second position to a third position having the coordinates $X_3, Y_3$ $$X_3 = X_2 \cos A_2 - Y_2 \sin A_2$$

$$Y_3 = X_2 \sin A_2 + Y_2 \cos A_2 \qquad 2.$$

and, combining equations (1) and (2), $$X_3 = X_1 \cos (A_1 + A_2) - Y_1 \sin (A_1 + A_2)$$

$$Y_3 = X_1 \sin (A_1 + A_2) + Y_2 \cos (A_1 + A_2) \qquad 3.$$

The convention adopted in applying equations (1), (2) and (3) to FIG. 1 is that counterclockwise rotation is positive. Thus, in FIG. 1, $A_1$ is negative and $A_2$ is positive.

Figure 2:
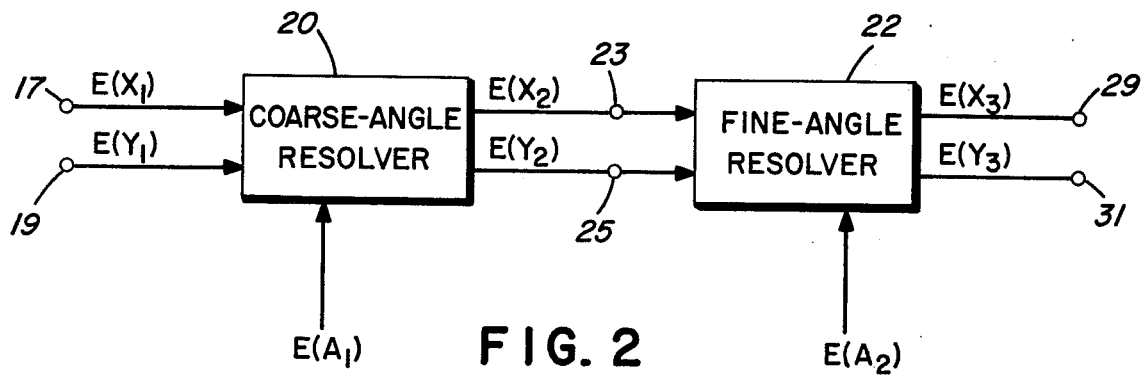
FIG. 2 is a block diagram showing cascaded coarse and fine-angle resolvers forming the resolver apparatus.

Equation (3) implies that two resolvers, with input angles $A_1$ and $A_2$ may be coupled in cascade to perform as a single resolver with the input angle $A = A_1 + A_2$. As shown in FIG. 2, analog voltages $E(X_1)$ and $E(Y_1)$ corresponding to the orthogonal coordinates $X_1, Y_1$ are applied to input terminals 17 and 19 of a coarse-angle resolver 20. A digital signal $E(A_1)$ corresponding to the angle $A_1$ is also applied to resolver 20. This results in voltages $E(X_2)$ and $E(Y_2)$ being generated at the output terminals 23 and 25 of resolver 20 corresponding to the orthogonal coordinates $X_2, Y_2$.

Voltages $E(X_2)$ and $E(Y_2)$ are applied to the input of a fine-angle resolver 22. Also applied to resolver 22 is a digital signal $E(A_2)$ corresponding to the angle $A_2$, the signals combining to provide at the output terminals 29 and 31 of resolver 22 voltages $E(X_3)$ and $E(Y_3)$ corresponding to the coordinates $X_3, Y_3$ obtained by rotating the vector $X_1, Y_1$ through the angle $A = A_1 + A_2$. It will be understood that, as used in this specification, the symbols X, Y and A may refer to either a mathematical quantity or a voltage corresponding to that mathematical quantity.

In the specific embodiment to be discussed, the angle A is represented by a 14 bit binary number. The most significant bit (MSB) represents 180°, the next 90° and so on to the least significant bit (LSB) representing $360° \times 2^{-4} = 0.022°$, or 79'' of arc.

Referring to FIG. 2, assume that $A_1$ can have only the following 16 discrete values:

TABLE I

| VALUE OF $A_1$ | BINARY REPRESENTATION $E(A_1)$ |
|---|---|
| 11.25° | 0000 |
| 33.75° | 0001 |
| 56.25° | 0010 |
| 78.75° | 0011 |
| 101.25° | 0100 |
| 123.75° | 0101 |
| 146.25° | 0110 |
| 168.75° | 0111 |
| 191.25° | 1000 |
| 213.75° | 1001 |
| 236.25° | 1010 |
| 258.75° | 1011 |
| 281.25° | 1100 |
| 303.75° | 1101 |
| 326.25° | 1110 |
| 348.75° | 1111 |

As indicated in Table I, the selected succession of values, which are 22.5° apart, may be represented by the succession of 4-bit binary numbers from 0000 to 1111.

The 22.5° spaces between permissible values of $A_1$ may be filled by $A_2$ to produce a large number of closely spaced values for the total angle $A = A_1 + A_2$. If $A_2$ is represented by a 10-bit number wherein the increment between successive permissible values of $A_2$ is $22.5° \times 2^{-10} = 360° \times 2^{-14}$ and $-11.25° \leq A_2 < +11.25°$, the binary representations of typical values of $A_2$ are as follows:

TABLE II

| Binary Representation | Value of $A_2$ |
|---|---|
| 0000000000 | $-11.25°$ |
| 0000000001 | $-11.25° \times (1-2^{-9})$ |
| 0111111111 | $-11.25° \times 2^{-9}$ |
| 1000000000 | $0°$ |
| 1000000001 | $+11.25° \times 2^{-9}$ |
| 1111111111 | $+11.25° \times (1-2^{-9})$ |

The 14-bit number representing $A = A_1 + A_2$ may be obtained by writing down the 4-bits of $A_1$ from Table I followed by the 10-bits of $A_2$. Since the choice of $A_1$ and $A_2$ is limited, the representation of any angle A is unique. For example, let $A = 0°$; then $A_1 = +11.25°$ and $A_2 = -11.25°$ from which $$A = \underbrace{0000}_{A_1} \underbrace{0000000000}_{A_2}$$

As another example, let $A = 50°$; then $A_1 = 146.25°$ and $A_2 = 3.75°$ from which $$A = \underbrace{0110}_{A_1} \underbrace{1010101010}_{A_2}$$

Thus, in the solid-state resolver of FIG. 2, coarse-angle resolver 20 is a 4-bit device with input angle $A_1$ and fine-angle resolver 22 has the digital input angle $A_2$. Although FIG. 2 shows the fine-angle resolver 22 following 4-bit coarse-angle resolver 20, this order may be reversed without significantly affecting operation of the resolver apparatus.

Figure 3:
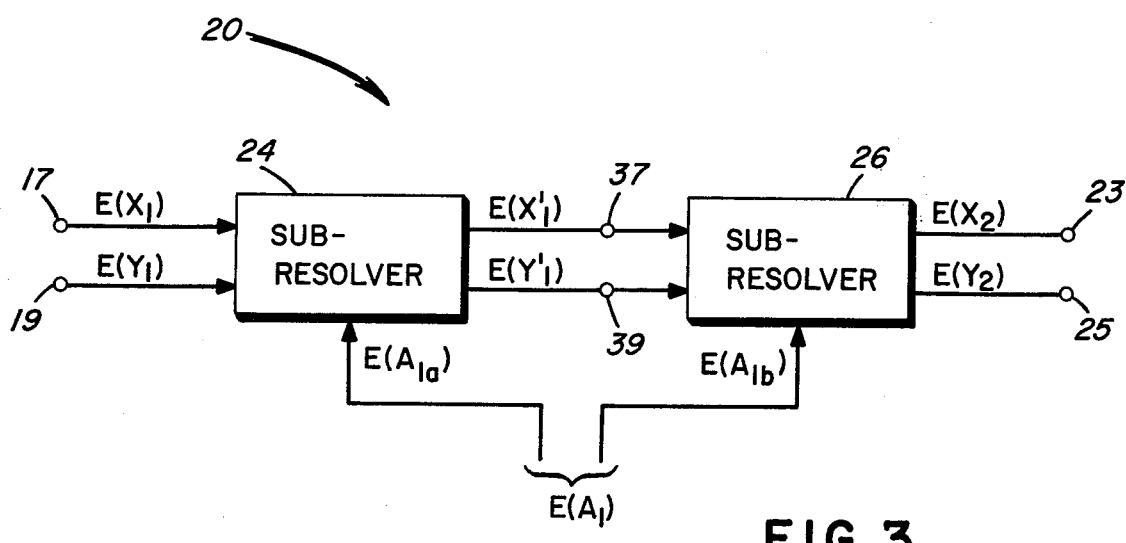
FIG. 3 is a block diagram showing a coarse-angle resolver having two cascaded sub-resolvers.

Coarse-angle resolver 20 may itself consist of two sub-resolvers 24 and 26 connected in cascade as shown in FIG. 3. A digital input signal corresponding to the angle $A_{1a}$ (consisting of the first two bits of $A_1$) is applied to sub-resolver 24 resulting in rotation of the input vector through an angle of either 0°, 90°, 180° or 270°. A digital input signal corresponding to the angle $A_{1b}$ (consisting of the last two bits of $A_1$) is applied to sub-resolver 26 resulting in rotation of its input through an angle of either 11.25°, 33.75°, 56.25° or 78.75°. The outputs of sub-resolver 24, $E(X_1')$ and $E(Y_1')$, are produced at terminals 37 and 39.

Applying equations (1), to sub-resolver 24 (with $X_1'$, $Y_1'$ replacing $X_2, Y_2$ therein), the following four permissible relations are obtained between the input vector having the coordinates $X_1, Y_1$ and the intermediate output $X_1', Y_1'$ obtained by rotating the input vector through the angle $A_{1a}$:

If $A_{1a} = 00 = 0°$ ; then $X_1' = X_1$
$Y_1' = Y_1$ $A_{1a} = 01 = 90°$ ; $X_1' = Y_1$
$Y_1' = X_1$ $A_{1a} = 10 = 180°$ ; $X_1' = -X_1$
$Y_1' = -Y_1$     (4)

$A_{1a} = 11 = 270°$ ; $X_1' = Y_1$
$Y_1' = -X_1$

Figure 4A:
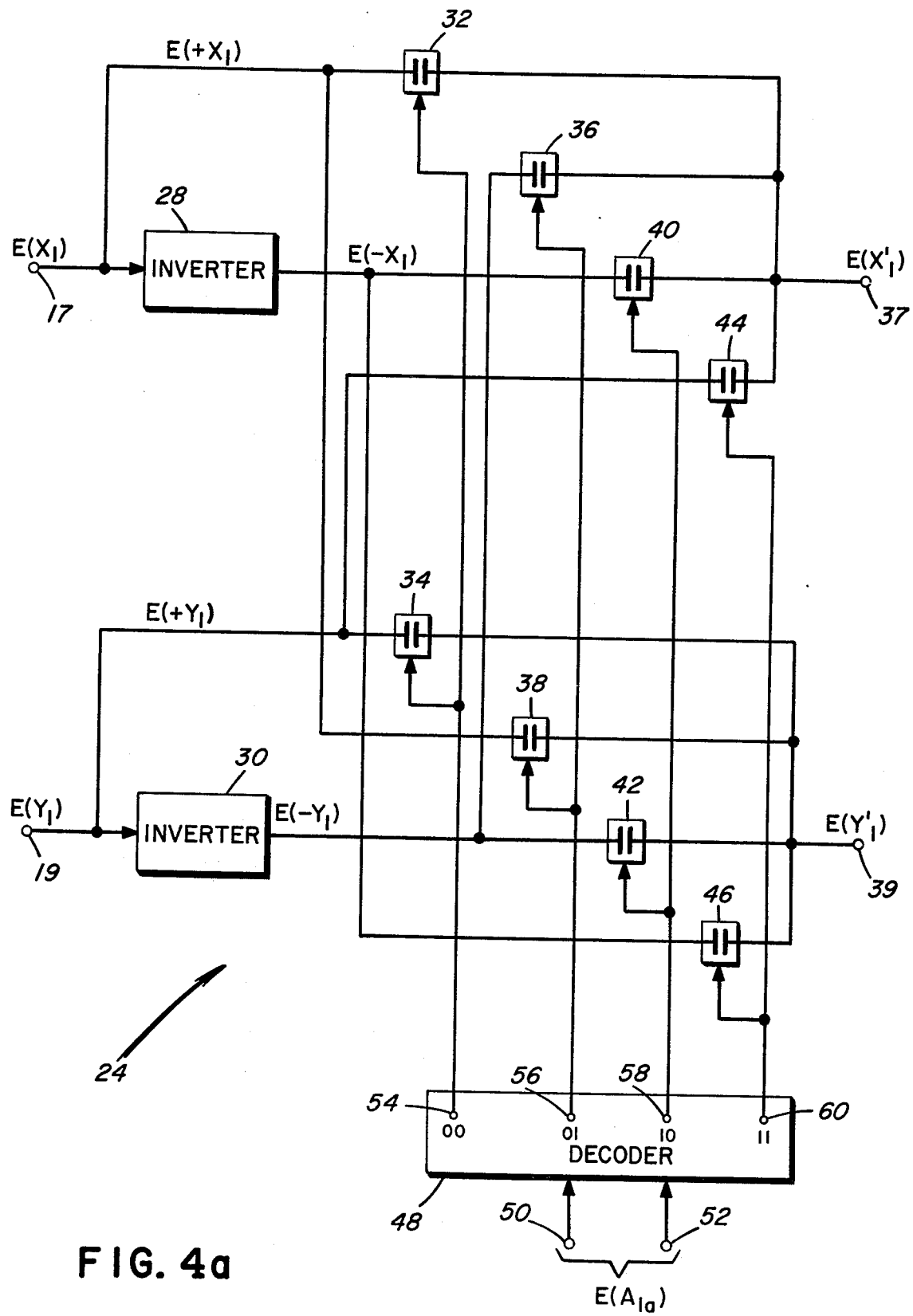
FIG. 4a shows schematically one of the two sub-resolvers of FIG. 3.

A typical circuit for sub-resolver 24 is shown in FIG. 4a. In sub-resolver 24, the input voltages $E(X_1)$ and $E(Y_1)$ representing a vectorial signal $V_1$ are applied to inverters 28 and 30 respectively and also to switches 32, 38, and 34, 44 respectively. Switches 32, 34, 38 and 44 are part of a network of eight switches which also includes switches 36, 40, 42 and 46, all of which are controlled by a decoder 48.

Decoder 48 receives the 2-bit signal $A_{1a}$ consisting of the first two bits of $A_1$ at input terminals 50 and 52 respectively. If the signals on terminals 50 and 52 are both zero (00), then decoder output terminal 54 is energized closing switches 32 and 34. Similarly, if the input signal at terminals 50, 52 is 01, 10 or 11, a corresponding terminal 56, 58 or 60 is energized. A 01 signal energizes terminal 56 closing switches 36 and 38, a 10 signal energizes terminal 58 closing switches 40 and 42 and a 11 signal energizes terminal 60 closing switches 44 and 46.

The output of inverter 28 is connected to the inputs of switches 40 and 46 and the output of inverter 30 is connected to the inputs of switches 36 and 42. The outputs of switches 32, 36, 40 and 44 are connected together to deliver a voltage $E(X_1')$ at output terminal 37 corresponding to the coordinate $X_1'$ of a vector $V_2$ obtained by rotating the input vector $X_1$, $Y_1$ through the angle $A_{1a}$. Similarly, the outputs of switches 34, 38, 42 and 46 are connected together to deliver a voltage $E(Y_1')$ at output terminal 39 corresponding to the coordinate $Y_1'$ of the vector obtained by rotating the input vector through the angle $A_{1a}$.

When the decoder input signal $A_{1a}$ is 00, switches 32 and 34 are closed and the output voltages $E(X_1')$ and $E(Y_1')$ are equal to $E(X_1)$ and $E(Y_1)$ in accordance with the first set of equations (4). Similarly, a decoder input signal 01 closes switches 36 and 38 making the voltage $E(X_1')$ equal the voltage $E(-Y_1)$ at the output of inverter 30 and the output voltage $E(Y_1')$ equal the input voltage $E(X_1)$ in accordance with the second set of equations (4). In the same way, it can be seen that the voltages $E(X_1')$ and $E(Y_1')$ at the outputs of sub-resolver 24 correspond to the third and fourth sets of equations (4) when $A_{1a}$ equals 10 and 11.

For the sub-resolver 26, equations (1) (with appropriate changes of variables), yield the following four permissible relations between the intermediate input $X_1'$, $Y_1'$ and the output $X_2$, $Y_2$ obtained by rotating the intermediate input vector through the angle $A_{1b}$:

If $A_{1b} = 00 = 11.25°$ ; then $X_2 = 0.9808X_1' - 0.1951Y_1'$
$Y_2 = 0.1951X_1' + 0.9808Y_1'$ $A_{1b} = 01 = 33.75°$ ; $X_2 = 0.8315X_1' - 0.5556Y_1'$
$Y_2 = 0.5556X_1' + 0.8315Y_1'$    (5)

$A_{1b} = 10 = 56.25°$ ; $X_2 = 0.5556X_1' - 0.8315Y_1'$
$Y_2 = 0.8315X_1' + 0.5556Y_1'$ $A_{1b}$ 1b 11 = 78.75° ; $X_2 = 0.1951X_1' - 0.9808Y_1'$
$Y_2 = 0.9808X_1' + 0.1951Y_1'$

Figure 4B:
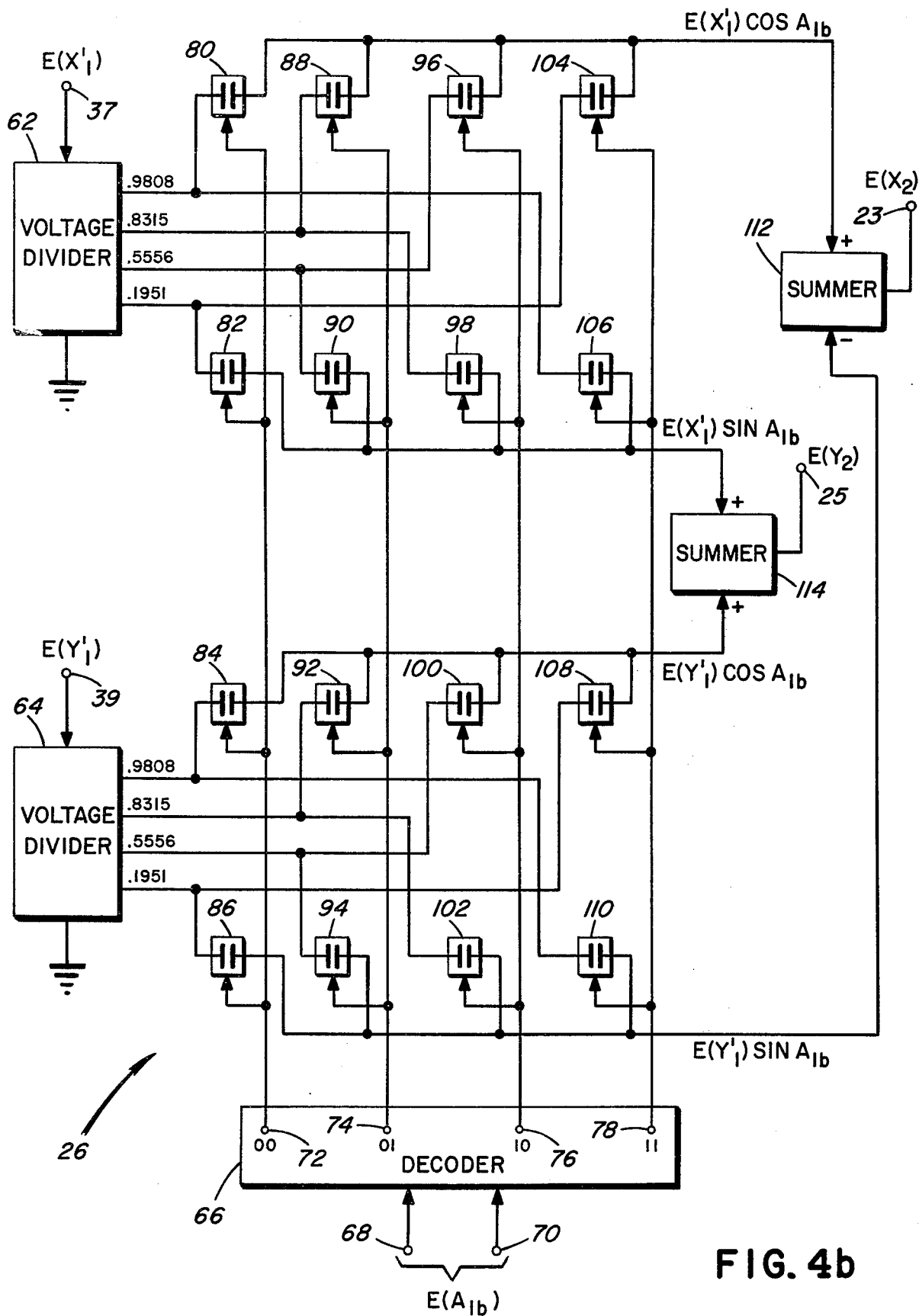
FIG. 4b shows schematically the other of the sub-resolvers of FIG. 3.

FIG. 4b shows a typical sub-resolver 26 for solving equations (5). The input voltages $E(X_1')$ and $E(Y_1')$ to sub-resolver 26 are applied to voltage dividers 62 and 64, respectively, each voltage divider having four outputs providing voltages equal to 0.9808, 0.8315, 0.5556 and 0.1951 of the corresponding input voltage. The eight analog voltages generated at the outputs of voltage dividers 62 and 64 are coupled to a 4×4 matrix of switches controlled by a decoder 66.

Decoder 66 receives the two-bit input signal $E(A_{1b})$ consisting of the third and fourth bits of $A_1$ at a pair of input terminals 68 and 70. If the signals at both terminals 68 and 70 are zero (00), the decoder output terminal 72 is energized. Similarly, if the two-bit signal $E(A_{1b})$ is 01, 10 or 11, terminals 74, 76, or 78, respectively are energized.

In greater detail, if the third and fourth bits of signal $A_1$ (i.e., signal $A_{1b}$) are 00, terminal 72 is energized closing switches 80, 82, 84 and 86. The closing of switches 80 and 86 applies voltages $E(X_1')$ cos 11.25° = 0.9808 $E(X_1')$ and $E(Y_1')$ sin 11.25° = 0.1951 $E(Y_1')$ to the plus (+) and minus (−) inputs respectively of a summer 112. This produces at the output of summer 112 a voltage $E(X_2)$ corresponding to the coordinate $X_2 = 0.9808$ $X_1' - 0.1951$ $Y_1'$; i.e., the X coordinate of input vector $X_1'$, $Y_1'$ rotated through 11.25° in accordance with the first of equations (5). Simultaneously, the closing of switches 82 and 84 applies voltages $E(X_1')$ sin 11.25° = 0.1951 $E(X_1')$ and $E(Y_1')$ cos 11.25° = 0.9808 $E(Y_1')$ to the inputs of summer 114. Summer 114 adds both input signals to produce an output signal $E(Y_2)$ corresponding to 0.1951 $X_1' + 0.9808$ $Y_1'$ as required by the second of equations (5).

Similarly, an input signal $A_{1b}$ of 01 corresponding to 33.75° at terminals 68 and 70 energizes terminal 74 thereby closing switches 88, 90, 92 and 94. Closing switches 88 and 94 applies voltages equal to 0.8315 $E(X_1')$ and 0.5556 $E(Y_1')$ to the plus and minus inputs respectively of summer 112. This produces a voltage at the output of the summer $E(X_2)$ corresponding to $X_2 = 0.8315$ $X_1' - 0.5556$ $Y_1'$ which is the X coordinate of the vector $X_1'$, $Y_1'$ rotated through 33.75°. In the same way, closing switches 90 and 92 provides voltages 0.5556 $E(X_1')$ and 0.8315 $E(Y_1')$ to the inputs of summer 114. This produces a voltage corresponding to the Y component, $Y_2 = 0.5556$ $X_1' + 0.8315$ $Y_1'$ of the vector $X_1'$, $Y_1'$ rotated through an angle of 33.75° in accordance with the third and fourth equations of equations (5).

Without repeating the detailed description, it will be appreciated that if $A_{1b} = 10$, terminal 76 is energized closing switches 96, 98, 100 and 102 thereby providing voltages corresponding to the fifth and sixth equations of equations (5) at the outputs of summers 112 and 114 respectively, and that if $A_{1b} = 11$, terminal 78 is energized causing switches 104, 106, 108 and 110 to close producing voltages corresponding to the last two equations of equations (5) at the outputs of summers 112 and 114.

Thus, with voltages $E(X_1)$ and $E(Y_1)$ applied to sub-resolver 24 of coarse-angle resolver 20, the circuit of FIG. 4a rotates the resultant vector voltage through 0°, 90°, 180° or 270° in accordance with the value of angle $A_{1a}$ to produce voltages $E(X_1')$ and $E(Y_1')$. Similarly, the circuit of FIG. 4b rotates voltages $E(X_1')$ and $E(Y_1')$ through 11.25°, 33.75°, 56.25° or 78.75° in accordance with the value of angle $A_{1b}$ to produce output voltages $E(X_2)$ and $E(Y_2)$ corresponding to rotation of the input vector $E(X_1)$ and $E(Y_1)$ through an angle equal to $A_1 = A_{1a} + A_{1b}$. While sub-resolvers 24 and 26 comprise part of my invention, they are not novel per se and the same result could be achieved using other types of circuitry.

The fine angle resolver 22 uses the binary representation of input angle $A_2$ described in Table II. Instead of employing the ideal resolver equations (2), the following pair of "small angle equations" are used to obtain voltages corresponding to rotation of the input vector $X_2$, $Y_2$ through the angle $A_2$ to obtain an output vector $X_3$, $Y_3$:

$$X_3 = X_2 - B/2 \; (Y_3 + Y_2)$$
$$Y_3 = Y_2 + B/2 \; (X_3 + X_2) \qquad 6.$$

wherein B is proportional to the input angle $A_2$ and the proportionality factor is close to unity when $A_2$ is measured in radians.

It can be shown that equations (6) are a very good approximation to equations (2); and the electronic hardware required to implement equations (6) is substantially less complex than would be required for equations (2). More specifically, it can be demonstrated that the magnitude of the output vector having components $X_3$, $Y_3$ is the same as the magnitude of the input vector having components $X_2$, $Y_2$ when equations (6) are used. Thus, the use of equations (6) introduce no error in the magnitude of the output vector.

Equations (6) do introduce a small error in the angle of the output vector but it can be shown that B in equations (6) is almost equal to $A_2$ in equations (2) when $A_2$, the absolute value of $A_2$, $|A_2|$, is small. The error is the approximation obtained by substituting $B = A_2$, in radians, in equations (6) is zero for $A_2 = 0$, and this error increases as the cube of $A_2$. For example, if $|A_2| \leq 11.25°$ (0.196 radian), the greatest discrepancy between B and A is 0.00063 radian = 0.036°.

This approximation, while quite good, may be improved by replacing the equality $B = A_2$ with the equation:

$$B = KA_2, \qquad 7.$$

where K is a constant which returns the error to zero when $Z_2$ increases to its maximum value $A_m$. The value of K may be determined by substituting $A_m$ in the equation:

$$K = 2/A_m \tan A_m/2 \qquad 8.$$

For example, if $A_m = 11.25°$ (0.196 radian) the value of K is 2/0.196 tan 11.25°/2 = 1.00323

Figure 5:
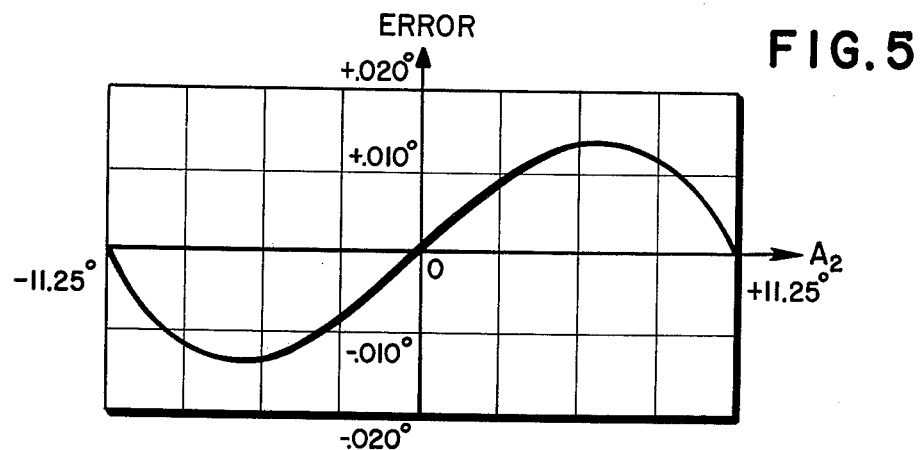
FIG. 5 is a graph illustrating the angular error produced by a typical fine-angle resolver of the type shown in FIG. 6.

FIG. 5 is a graph of the angular error incurred by using the equations (6) in place of equations (2). As shown, if $-11.25° \leq A_2 < +11.25°$, the maximum error of $\pm 0.014°$ occurs at $A_2 = \pm 6.5°$.

The fine-angle resolver 22 of my invention solves the two equations (6) simultaneously. The inputs to the resolver are $E(X_2)$, $E(Y_2)$ from coarse-angle resolver 20 (FIG. 2) and the input $E(A_2)$ corresponds to the second part $A_2$ of the total angle A. Stated another way, resolver 22 can be considered to be an analog computer with a digital input $A_2$ and analog vector component inputs $X_2$, $Y_2$. The outputs of the computer are the vector components $X_3$, $Y_3$ represented by the voltages $E(X_3)$, $E(Y_3)$.

Figure 6:
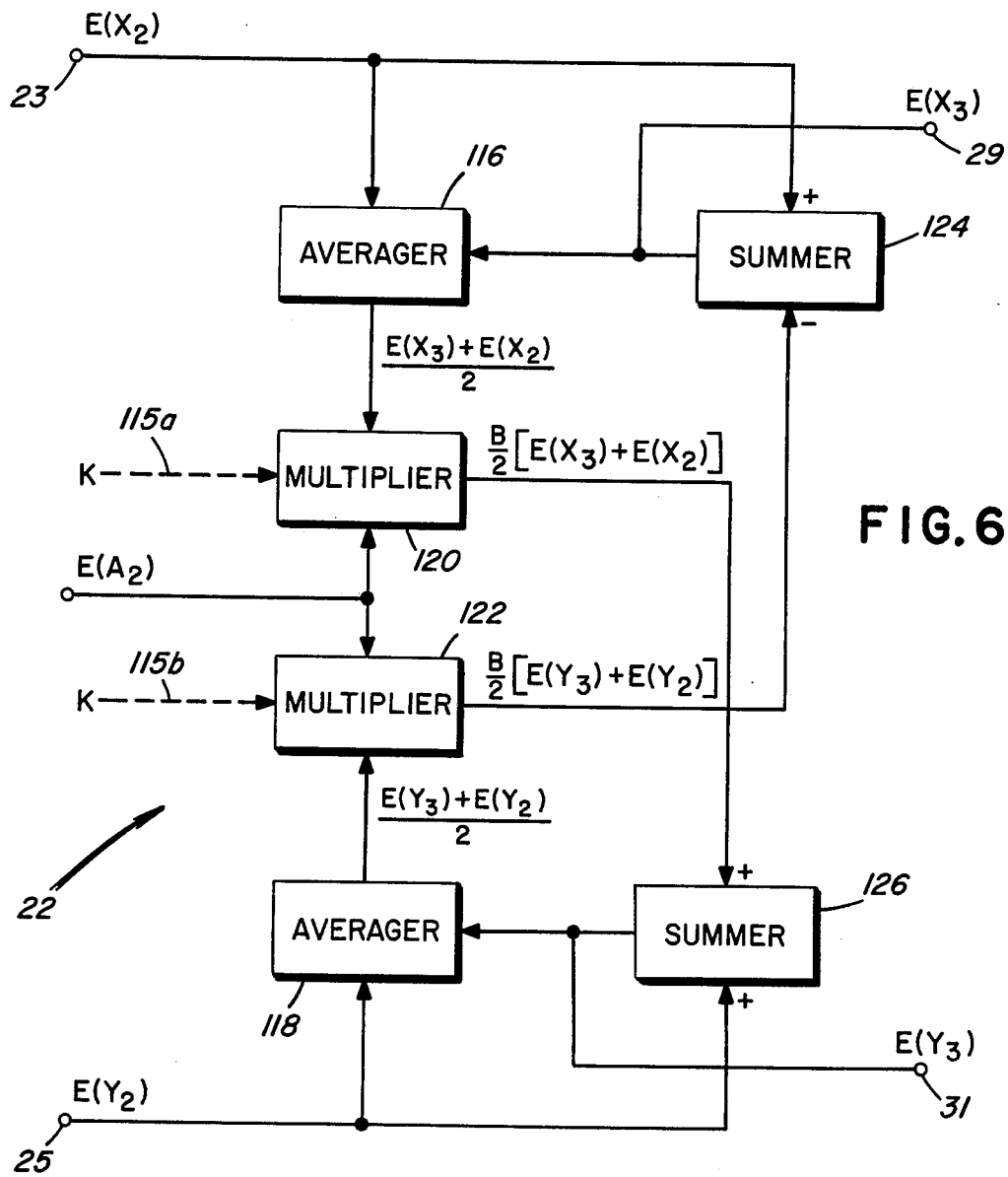
FIG. 6 is a block diagram of a fine-angle resolver for use with the resolver apparatus.

Referring to FIG. 6, first and second averaging circuits 116 and 118 form the averages of the input and output voltages $$\frac{E(X_3) + E(X_2)}{2} \quad \text{and} \quad \frac{E(Y_3) + E(Y_2)}{2}$$

respectively. Two multipliers 120 and 122 form the product of these averages with the input $E(A_2)$ producing the outputs $B/2 \; [E(X_3) + E(X_2)]$ and $B/2 \; [E(Y_3) + E(Y_2)]$ respectively. The proportionality factor $K = B/A_2$ (equation 7) is represented by dashed line arrows 115a, 115b to multipliers 120 and 122 to indicate that it is a scale-factor adjustment and not a variable input.

Summing circuit 124 receives as inputs the input voltage $E(X_2)$ and the output of multiplier 122 to produce the output voltage $E(X_3)$ as the algebraic difference between these inputs. Similarly, summing circuit 126 receives as inputs the input voltage $E(Y_2)$ and the output of multiplier 120 to produce the output voltage $E(Y_3)$ as the algebraic sum of these inputs.

More specifically, the input $E(A_2)$ is applied to the inputs of multipliers 120 and 122 which have the same scale-factor adjustments K. The input voltage $E(X_2)$ is coupled to an input of averager 116 and also to an input of summer 124. The voltage $E(Y_2)$ is coupled to an input of averager 118 and to an input of summer 126. The output of averager 116 is connected to an input of multiplier 120 and the output of averager 118 to an input of multiplier 122. The outputs of multipliers 120 and 122 are coupled respectively to inputs of summers 126 and 124.

Since the input to averager 116 from summer 124 is $E(X_3)$ and the other input is $E(X_2)$, the signal fed to multiplier 120 is $$\frac{E(X_3) + E(X_2)}{2}.$$

Multiplier 120 multiplies the input $E(A_2)$ by the output of averager 116 to obtain the output $$B/2 \; [E(X_3) + E(X_2)],$$

where B is equal to $KA_2$. This output, when coupled to a positive input of summer 126 is added to the input $E(Y_2)$ to obtain $$B/2 \; [E(X_3) + E(X_2)] + E(Y_2).$$

Since, from the second of equations (6), $$B/2 \; (X_3 + X_2) + Y_2 = Y_3$$

it follows that the voltage at output terminal 31 is $E(Y_3)$.

Similarly, the output of multiplier 122 is $$B/2 \; [E(Y_3) + E(Y_2)]$$

and when this is subtracted from the input $E(X_2)$ in summer 124, the output of the summer at terminal 29 is, from the first of equations (6), $$E(X_2) - B/2 \; [E(Y_3) + E(Y_2)] = E(X_3).$$

Figure 7:
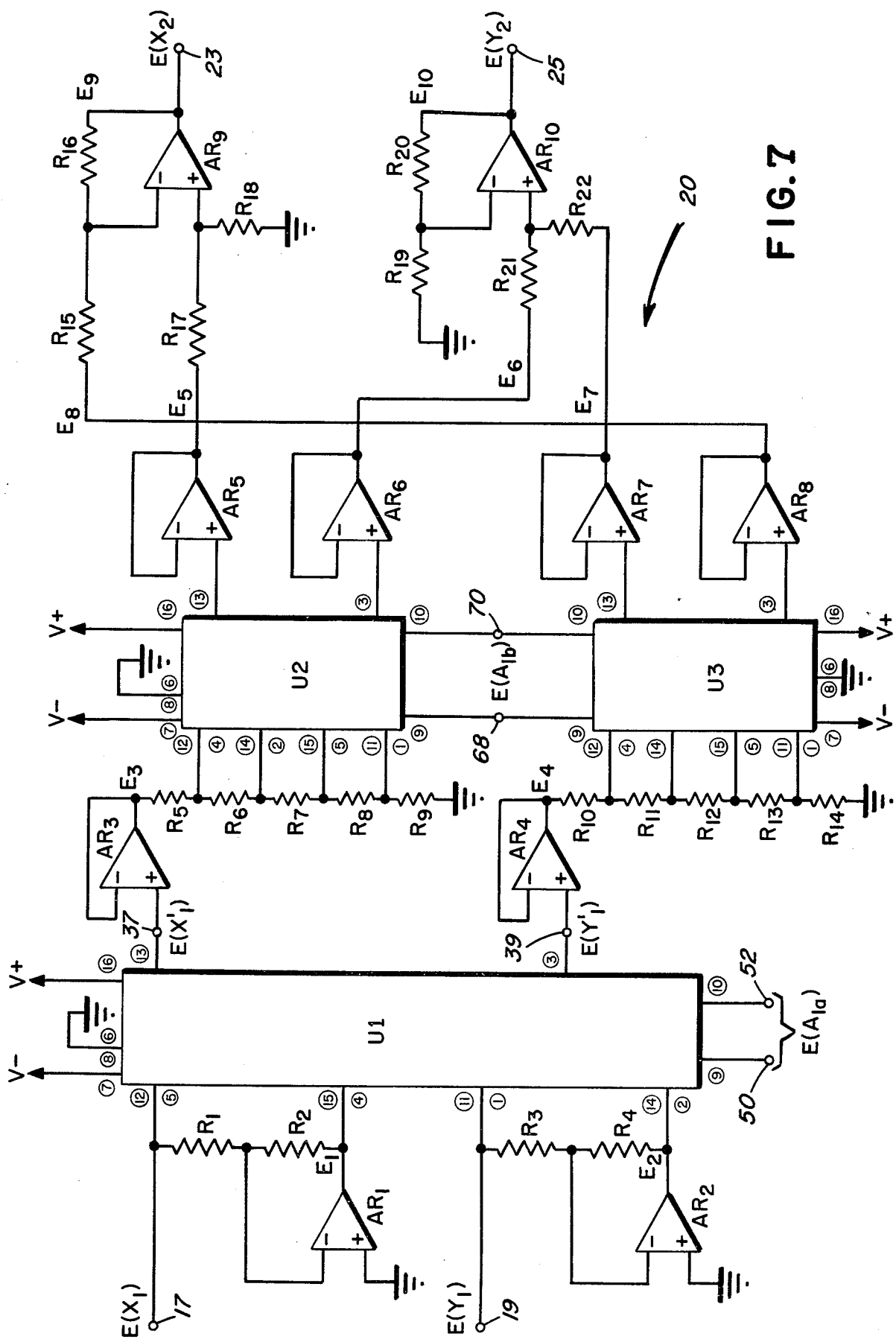
FIG. 7 is a practical embodiment of the coarse-angle resolver of FIGS. 4a and 4b.

FIG. 7 shows a practical embodiment of the coarse-angle resolver of FIGS. 4a and 4b. In FIG. 7, the symbols $AR_1$, $AR_2$, etc. designate operational amplifiers and the symbols $E_1$, $E_2$ etc. designate their respective output voltages. The symbols $R_1$, $R_2$ etc. are used to indicate resistors and their respective resistance values are $R_1$, $R_2$. Three differential four-channel multiplexer/demultiplexer digital integrated circuits type CD 4052 (available from the RCA Corporation) $U_1$, $U_2$ and $U_3$ are used in the coarse-angle resolver. Each of these integrated circuits has 16 numbered terminals shown by circled numerals in FIG. 7. They are provided with negative and positive power supply voltages $-V$ and $+V$ at their terminals 7 and 16 respectively.

Operational amplifier $AR_1$ and matched input and feedback resistors $R_1$, $R_2$ comprise inverter 28 of FIG. 4a and operational amplifier $AR_2$, together with resistors $R_3$ and $R_4$, correspond to inverter 30. The voltage $E_1$ at the output of operational amplifier $AR_1$ is equal to $E(-X_1)$ and the voltage $E_2$ at the output of operational amplifier $AR_2$ is equal to $E(-Y_1)$. Resistances $R_1 - R_4$ are nominally 10,000 ohms each.

Integrated circuit $U_1$ performs the function of the two-bit decoder 48 of FIG. 4a and switches 32–46. Terminals 9 and 10 of the multiplexer $U_1$ correspond to the inputs to decoder 48 and therefore are coupled to terminals 50 and 52. The output voltages $E(X_1')$ an $E(Y_1')$ at terminals 37 and 39 correspond to those of equations (4). These voltages are buffered by operational amplifiers $AR_3$ and $AR_4$ coupled between terminals 37, 39 and resistors $R_5$, $R_{10}$, respectively.

Resistors $R_5 - R_9$ correspond to the voltage divider 62 of FIG. 4b and resistors $R_{10} - R_{14}$ to the voltage divider 64. Each of the dividers is made of a string of five resistors having the following nominal values of resistance:

| | |
|---|---|
| $R_5$, $R_{10}$ = | 192 ohms |
| $R_6$, $R_{11}$ = | 1493 |
| $R_7$, $R_{12}$ = | 2759 |
| $R_8$, $R_{13}$ = | 3605 |
| $R_9$, $R_{14}$ = | 1951 |
| Total | 10,000 ohms |

Thus, the four junctions in each of the voltage dividers provide the ratios 0.9808, 0.8315, 0.5556 and 0.1951, as shown in FIG. 4b, and required to implement equations (5).

Each of the voltage dividers is coupled separately to an integrated circuit $U_2$, $U_3$. The terminals 9 and 10 of each of the multiplexers is coupled to input terminals 68, 70 to which the input $E(A_{1b})$ is applied. The outputs from the banks of switches in the integrated circuits $U_2$, $U_3$ at terminals 13 and 3 are buffered by voltage followers $AR_5 - AR_8$.

The subassembly of voltage dividers $R_5 - R_{14}$, integrated circuits $U_2$ and $U_3$ and amplifiers $AR_3 - AR_8$ provide the following voltages corresponding to those indicated in FIG. 4b:

$$E_5 = E_3 \cos A_{1b}$$

$$E_6 = E_3 \sin A_{1b}$$

$$E_7 = E_4 \cos A_{1b}$$

$$E_8 = E_4 \sin A_{1b}, \qquad 9.$$

where $E_3 = E(X_1')$ and $E_4 = E(Y_1')$.

Resistors $R_{15} - R_{18}$ and operational amplifier $AR_9$ comprise summer 112 and resistors $R_{19} - R_{22}$ and operational amplifier $AR_{10}$ comprise summer 114. In the summer circuits, the resistances $R_{15} - R_{22}$ are nominally 10,000 ohms each.

Resistors $R_{17}$ and $R_{18}$ divide the voltage $E_5$ in half, establishing ½ $E_5$ at the non-inverting input of operational amplifier $AR_9$. Resistors $R_{15}$ and $R_{16}$ average the voltages $E_8$ and $E_9$ to establish ½ $(E_8 + E_9)$ at the inverting input. The amplifier $AR_9$ produces the output voltage $E_9$ which operates through the feedback resistor $R_{16}$ to make the voltage at the inverting input equal to the voltage at the non-inverting input. Then $$E_8 + E_9 = E_5$$

or $$E_9 = E_5 - E_8 \qquad 10.$$

Resistors $R_{21}$ and $R_{22}$ average the voltages $E_6$ and $E_7$ establishing ½ $(E_6 + E_7)$ at the non-inverting input of operational amplifier $AR_{10}$. Resistors $R_{19}$ and $R_{20}$ divide $E_{10}$ in half to establish ½ $E_{10}$ at the inverting input. Then $$E_{10} = E_6 + E_7. \qquad 11.$$

If $X_2$ and $Y_2$ are substituted for $E_9$ and $E_{10}$ in equations (10) and (11), $X_1'$ and $Y_1'$ are substituted for $E_3$ and $E_4$ in equation (9) and $A_1$ substituted for $A_{1a} + A_{1b}$ then (see FIG. 3)

$$X_2 = X_1' \cos A_{1b} - Y_1' \sin A_{1b} = X_1 \cos A_1 - Y_1 \sin A_1$$

$$Y_2 = X_1' \sin A_{1b} + Y_1' \cos A_{1b} = X_1 \sin A_1 + Y_1 \cos A_1.$$

Figure 8:
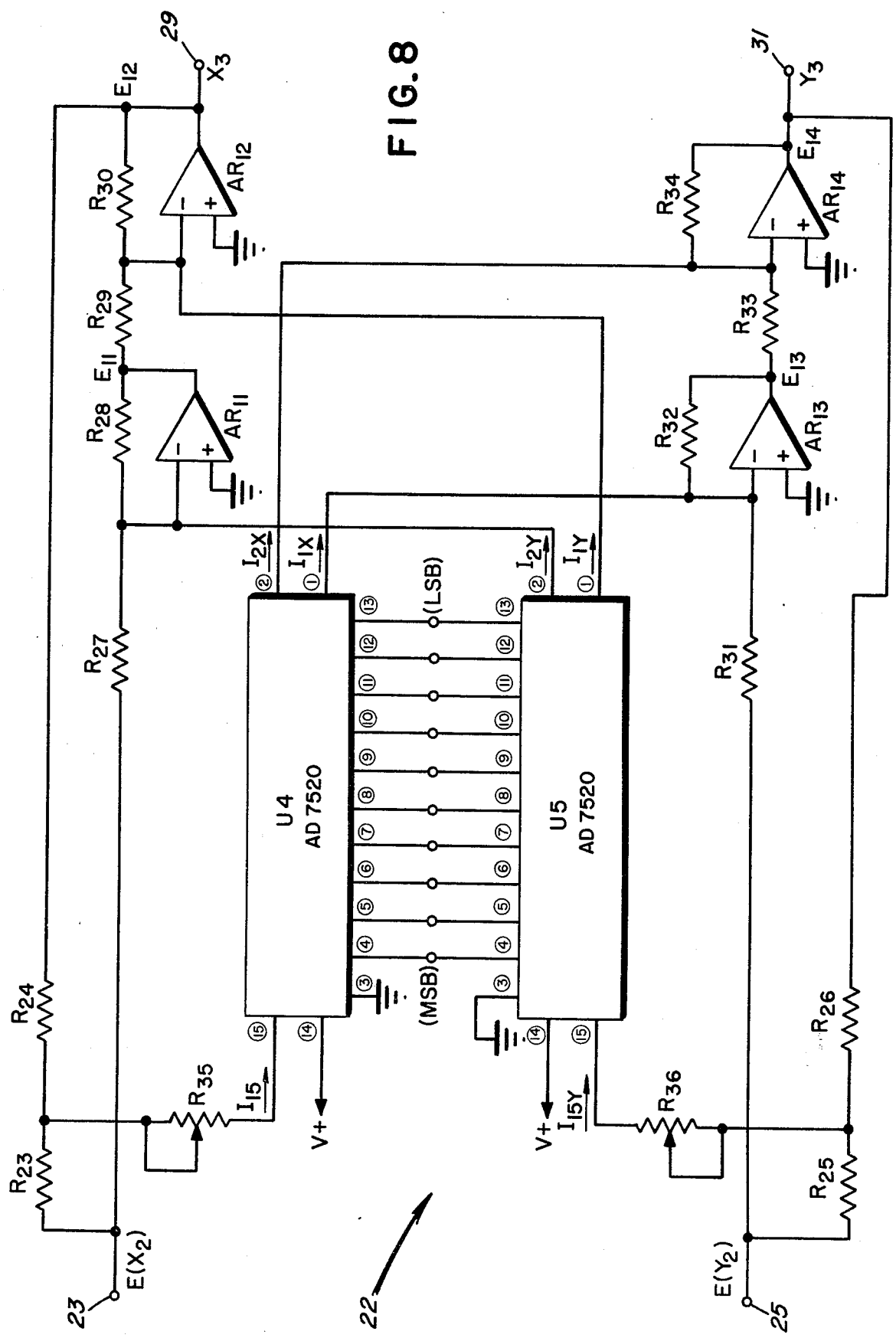
FIG. 8 is a practical embodiment of the fine-angle resolver of FIG. 6.

The fine-angle resolver shown in block diagram form in FIG. 6 is illustrated in great detail in FIG. 8. In FIG. 8, two matched pairs of resistors $R_{23}$, $R_{24}$ and $R_{25}$, $R_{26}$ serve as the averaging circuits 116 and 118 of FIG. 6. The multipliers 120 and 122 are realized by two integrated circuits $U_4$ and $U_5$ which may be type AD7520 manufactured by Analog Devices. The AD7520 is a monolithic 10-bit multiplying digital analog converter and, as indicated by the circled numerals in FIG. 8, is provided with 16 pins. Integrated circuits $U_4$ and $U_5$ are provided with a positive power supply voltage at their terminals 14 and have an input current $I_{15}$ which enters at terminal 15. The input current $I_{15}$ separates into two output currents $I_1$ and $I_2$ at terminals 1 and 2, respectively.

Both multipliers $U_4$ and $U_5$ have the common input $E(A_2)$. $E(A_2)$ is represented in FIG. 8 by 10 binary bits coupled to terminals 4 – 13 of each of the integrated circuits $U_4$ and $U_5$, the most significant bit being applied to terminals 4 and the least significant bit being supplied to terminals 13. If the input $E(A_2)$ has the binary representation described by Table II, $$\frac{I_1 - I_2}{I_{15}} = \frac{E(A_2)}{E(A_m)}, \qquad 12.$$

where $E(A_m)$ is the maximum value of $E(A_2)$; that is, in the specific embodiment disclosed herein $A_m = 11.25°$.

Two matched pairs of resistors $R_{27}$, $R_{30}$ and $R_{28}$, $R_{29}$, together with operational amplifiers $AR_{11}$ and $AR_{12}$ comprise summer 124 of FIG. 6, and two matched pairs of resistors $R_{31}$, $R_{34}$ and $R_{32}$, $R_{33}$, together with operational amplifiers $AR_{13}$, $AR_{14}$, make up summer 126. In a typical embodiment, all 12 resistances $R_{23} - R_{34}$ have a nominal value of 10,000 ohms.

Two adjustable resistors $R_{35}$, $R_{36}$ determine the scale factor K indicated by the dash lines 115a, 115b in FIG. 6. In addition to serving as a scale factor, these resistors provide the function, when used with the AD7520 monolithic multiplying D/A converters, of compensating for the broad manufacturing tolerance on input impedance inherent in these converters.

The circuitry in FIG. 8 is arranged to make the input current $I_{15X}$ of integrated circuit $U_4$ proportional to the average ½ $[E(X_3) + E(X_2)]$ of the output and input voltages. The adjustable resistor $R_{35}$ connects the input terminal 15 of integrated circuit $U_4$ to the junction of resistors $R_{23}$ and $R_{24}$. The proportionality factor relating the current $I_{15X}$ to the voltage ½ $[E(X_3) + E(X_2)]$ is a resistance $R_x$ which is equal to the series sum of three resistances: (1) the parallel combination of the resistances $R_{23}$ and $R_{24}$ (nominally 5,000 ohms); (2) the adjustable resistance $R_{35}$; and (3) the impedance looking into terminal 15 (nominally 10,000 ohms). In sum, $$R_X I_{15X} = \tfrac{1}{2} [E(X_3) + E(X_2)]$$

and from equation (12), $$R_X(I_{1X} - I_{2X}) = \frac{E(A_2)}{E(A_m)} \cdot \frac{E(X_3) + E(X_2)}{2} \qquad 13.$$

where $I_{1X}$ and $I_{2X}$ are the two output currents from integrated circuit $U_4$. $R_X$ is adjustable because it includes $R_{35}$.

Similarly, the input current $I_{15Y}$ of integrated circuit $U_5$ is proportional to the average ½ $[E(Y_3) + E(Y_2)]$ of the output and input voltages. The adjustable resistor $R_{36}$ connects the input terminal 15 of integrated circuit $U_5$ to the junction of resistors $R_{25}$ and $R_{26}$; consequently, there is an adjustable resistance $R_Y$ such that $$R_Y(I_{1Y} - I_{2Y}) = \frac{E(A_2)}{E(A_m)} \cdot \frac{E(Y_3) + E(Y_2)}{2} \qquad 14.$$

where $I_{1Y}$ and $I_{2Y}$ are the two output currents from integrated circuit $U_5$.

Amplifier $AR_{11}$ operates through its feedback resistor $R_{28}$ to keep its non-inverting input at ground potential, so the current in $R_{28}$ is $E_{11}/R_{28}$ and the current in the input resistor $R_{27}$ is $E(X_2)/R_{27}$. Since the input impedance of operational amplifier $AR_{11}$ is very high, the sum of the currents to the input is zero; that is, $$\frac{E_{11}}{R_{28}} + \frac{E(X_2)}{R_{27}} + I_{2Y} = 0 .$$

Likewise, the sum of the currents into the non-inverting input of operational amplifier $AR_{12}$ is zero; that is, $$\frac{E_{12}}{R_{30}} + \frac{E_{11}}{R_{29}} + I_{1Y} = 0 .$$

The last two equations may be combined to eliminate $E_{11}$:

$$\frac{E_{12}}{R_{30}} - \frac{R_{28}}{R_{29}} \left( \frac{E(X_2)}{R_{27}} + I_{2Y} \right) + I_{1Y} = 0$$

But $R_{28} = R_{29}$ and $R_{27} = R_{30}$; so, with equation (14)

$$E_{12} = E(X_2) - \frac{R_{30}}{R_Y} \cdot \frac{E(A_2)}{E(A_m)} \cdot \frac{E(Y_3) + E(Y_2)}{2} \qquad 15.$$

A similar expression may be obtained for the output voltage $E_{14}$. Amplifiers $AR_{13}$ and $AR_{14}$ operate to enforce the conditions $$\frac{E_{13}}{R_{32}} + \frac{E(Y_2)}{R_{31}} + I_{1X} = 0$$

and $$\frac{E_{14}}{R_{34}} + \frac{E_{13}}{R_{33}} + I_{2X} = 0 .$$

But $R_{32} = R_{33}$ and $R_{31} = R_{34}$; so, with equation (13)

$$E_{14} = E(Y_2) + \frac{R_{34}}{R_X} \cdot \frac{E(A_2)}{E(A_m)} \cdot \frac{E(X_3) + E(X_2)}{2} \qquad 16.$$

Now $E_{12}$ in equation (15) and $E_{14}$ in equation (16) will be equal respectively to $E(X_3)$ and $E(Y_3)$ in equations (6) if (from equations (7) and (8))

$$\frac{R_{30}}{R_Y} = \frac{R_{34}}{R_X} = B \quad \frac{A_m}{A_2} = K\, A_m = 2 \tan \frac{A_m}{2}$$

For $A_m = 11.25°$, this becomes $$\frac{R_X}{R_{34}} = \frac{R_Y}{R_{30}} = 5.0766 ,$$

so that $R_X$ and $R_Y$ are nominally 50,766 ohms each.

In describing the preferred embodiment, it has been assumed that $A_2$ is represented digitally by ten binary bits; however, the number ten is in no way essential to the operation of the resolver apparatus. Further, it is not essential that $A_2$ be represented by binary bits since a binary coded decimal or any other code could also be used. Nor is it essential that the representation of $A_2$ be digital; for example D/A converters $U_4$ and $U_5$ may be replaced by analog multipliers which would require an analog representation for $A_2$.

In the preferred embodiment it has also been assumed that $A_m = 11.25°$ but this is not required for carrying out my invention. If the fine-angle resolver 22 is preceded by a five-bit resolver instead of a four-bit coarse-resolver 20, then $A_m = 5.625°$. Operation of the fine-angle resolver 22 can easily be adapted to this change by adjusting resistances $R_{35}$ and $R_{36}$ in FIG. 8 to different values, since they determine the scale factor for the two multiplying D/A converters. Since the theoretical error is proportional to the cube of $A_2$, the error which would be obtained if $A_m = 5.625°$ is ⅛ of the error with $A_m = 11.25°$; or, if the four-bit resolver 20 is replaced by a three-bit resolver with $A_m = 22.5°$, the error will be 8 times 0.014°.

$A_m$ can in fact have any value although it would be impractical for it to be greater than 45°. It is conceivable that some applications might require the fine-angle resolver 22 to operate at an angle of ± 30° or ± 15°, implying that $A_m = 30°$ or 15° respectively.

In the preferred embodiment described, the fine-angle resolver 22 follows the coarse-angle four-bit resolver 20; however, the resolver apparatus will operate just as well if the order is reversed. Further, it is permissible to separate the two sub-resolvers 24 and 26 and place the fine-angle resolver 22 between them.

What is claimed is:

1. A resolver for receiving an input signal having first and second components corresponding respectively to the orthogonal components $X_2$, $Y_2$ of an input vector and a third component corresponding to an angle $A_2$, said resolver generating an output signal having first and second components corresponding respectively to the orthogonal components $X_3$, $Y_3$ produced by rotation of said input vector through the angle $A_2$, comprising:

first and second averaging means, each of said first and second averaging means having a first input for receiving the first and second components of said input signal respectively, a second input and an output;

first and second multiplying means, each of said first and second multiplying means having a first input coupled to the output of said first and second averaging means respectively, a second input for receiving the third component of said input signal and an output; and first and second summing means, each of said summing means having a first input for receiving the first and second components of said input signal respectively, a second input coupled to the outputs of said second and first multiplying means respectively and an output coupled to the second inputs of said first and second averaging means respectively, the first and second components of said output signal being generated at the outputs of said first and second summing means respectively.

2. Apparatus as defined by claim 1, wherein the signals at the outputs of the first and second averaging means correspond to $$\frac{X_2 + X_3}{2} \text{ and } \frac{Y_2 + Y_3}{2}$$

respectively, and said first and second multiplying means multiply the outputs of said first and second averaging means, the third component of said input signal and a constant factor K to produce outputs $$KA_2 \ \frac{X_2 + X_3}{2} \text{ and } KA_2 \ \frac{Y_2 + Y_3}{2}$$

respectively.

3. Apparatus as defined by claim 2, wherein K is approximately equal to unity, $A_2$ being measured in radians.

4. Resolver apparatus for receiving simultaneously a vectorial input signal and an angular input signal, said vectorial input signal having first and second components corresponding respectively to the orthogonal components $X_1$, $Y_1$ of an input vector and said angular input signal having a coarse part and a fine part corresponding to the angles $A_1$ and $A_2$ respectively, said apparatus generating a vectorial output signal having first and second components corresponding respectively to the orthogonal components $X_3$, $Y_3$ of an output vector produced by rotation of said input vector through the angle $A_1 + A_2$, comprising:

first resolver means for receiving said vectorial input signal and one part of said angular input signal, said first resolver means generating a vectorial intermediate signal having first and second components corresponding respectively to the orthogonal components $X_2$, $Y_2$ of the intermediate vector produced by rotation of said input vector through the angle corresponding to said one part of said angular input signal; and second resolver means receiving said vectorial intermediate signal and the other part of said angular input signal, one of said first and second resolver means being a coarse-angle resolver and the other a fine-angle resolver, said fine-angle resolver comprising:

first and second averaging means, each having a first input, a second input and an output, said first inputs of said first and second averaging means respectively receiving the two signal components corresponding to either $X_1$, $Y_1$ or $X_2$, $Y_2$;

first and second multiplying means, each having a first input, a second input and an output, said first inputs of said first and second multiplying means being coupled respectively to the outputs of said first and second averaging means, and said second inputs of said first and second multiplying means both receiving the fine part of said angular input signal corresponding to the angle $A_2$; and first and second summing means, each having a first input, a second input and an output, said first inputs of said first and second summing means respectively receiving the same signal components received by said first inputs of said first and second averaging means, said second inputs of said first and second summing means being coupled to the outputs of said second and first multiplying means respectively, and said outputs of said first and second summing means being coupled to said second inputs of said first and second averaging means respectively, said first and second summing means generating at their respective outputs the two signal components corresponding to either $X_2$, $Y_2$ or $X_3$, $Y_3$.

5. Resolver apparatus as defined by claim 4, wherein said coarse-angle resolver comprises:

inverter means for receiving two orthogonal signal components of a vectorial signal corresponding to a vector $V_1$;

first switching means coupled to said inverter means and having first and second outputs, said first switching means receiving a signal corresponding to a first portion $A_{1a}$ of the coarse angle $A_1$ and generating signals at its first and second outputs corresponding to the orthogonal components of a vector $V_2$ produced by rotation of said vector $V_1$ through said angle $A_{1a}$;

voltage divider means coupled to the first and second outputs of said first switching means, said voltage divider means producing voltages which are predetermined fractions of the voltages at the first and second outputs of said first switching means; and second switching means coupled to said voltage divider means and having first and second outputs, said second switching means receiving a signal corresponding to a second portion $A_{1b}$ of the coarse angle $A_1$ and generating signals at its first and second outputs corresponding to the orthogonal components of the vector produced by rotation of said vector $V_2$ through said angle $A_{1b}$.

6. Resolver apparatus as defined by claim 5, wherein said second switching means coupled to said voltage divider means comprises:

a switching circuit receiving a signal corresponding to said angle $A_{1b}$ and having first, second, third and fourth outputs producing simultaneously four distinct voltages as functions of said angle $A_{1b}$;

first summing means coupled to the first and fourth outputs of said switching circuit; and second summing means coupled to the second and third outputs of said switching circuit.

7. Resolver apparatus as defined by claim 4, wherein said first resolver means is a coarse-angle resolver having applied thereto the coarse part of said angular input signal, and said second resolver means is a fine-angle resolver.

* * * * *